United States Patent [19]
Tsao et al.

[11] Patent Number: 6,046,061
[45] Date of Patent: Apr. 4, 2000

[54] METHOD OF INSPECTING WAFER WATER MARK

[75] Inventors: Li-Wu Tsao, Keelung; Tse-Wei Liu, Hsinchu; Cheng-Chieh Huang, Taipei Hsien; Tang Yu, Hsinchu Hsien; Eddie Chen, Hsinchu, all of Taiwan

[73] Assignee: United Silicon Incorporated, Hsinchu, Taiwan

[21] Appl. No.: 09/206,177

[22] Filed: Dec. 4, 1998

[30] Foreign Application Priority Data

Aug. 29, 1998 [TW] Taiwan .................................. 87114352

[51] Int. Cl.⁷ .......................... G01R 31/26; H01L 21/66
[52] U.S. Cl. .................................. 438/16; 438/14; 438/15
[58] Field of Search .................................. 438/16, 15, 14

[56] References Cited

U.S. PATENT DOCUMENTS

| | | |
|---|---|---|
| 5,503,708 | 4/1996 | Koizumi et al. . |
| 5,629,223 | 5/1997 | Thakur . |
| 5,803,980 | 9/1998 | Pas et al. . |
| 5,932,493 | 8/1999 | Akatsu et al. . |
| 5,943,549 | 8/1999 | Motoura et al. . |

*Primary Examiner*—Kevin M. Picardat
*Assistant Examiner*—D. Mark Collins
*Attorney, Agent, or Firm*—Jiawei Huang; J.C. Patents

[57] ABSTRACT

A method of water mark inspection. By forming a pattern on a test wafer, the water mark formed thereon directly reflects the features of a wafer product to be evaluated. The water mark is formed by simulating fabrication process conditions of forming the wafer product of which the performance is to be evaluated. Thus, after scanning the water mark by a defect inspection machine, the performance of the wafer product is evaluated.

18 Claims, 2 Drawing Sheets

METHOD OF INSPECTING WAFER WATER MARK

CROSS-REFERENCE TO RELATED APPLICATION

This application claims priority benefit of Taiwan application Ser. No. 87114352, filed Aug. 29, 1998 the full disclosure of which is incorporated herein by reference.

BACKGROUND OF THE INVENTION

1. Field of the Invention

The invention relates in general to a method of inspecting wafer water marks, and more particularly, to a method of inspecting wafer water marks using a patterned wafer.

2. Description of the Related Art

Typically, to ensure the quality of a wafer, a water mark formed during the process in a chemical station is inspected. For example, in a fabrication process with a sub-micron line width. before forming a gate oxide, a cleaning process is performed to ensure the quality of the gate oxide. This cleaning process greatly affects, or even determines the quality of the gate oxide layer formed subsequently. The cleaning process typically has the functions of removing particles, native oxide layer, organic chemicals, and metal contamination. During the cleaning process, in case of improperly controlling the technique of delivering or cleaning/drying, a water mark problem is caused.

In the example of forming a gate oxide layer, it is known that the quality of the gate oxide layer is a key factor which determines the performance of a metal-oxide semiconductor (MOS) device. When a gate oxide contains too much contamination or too many charges, the threshold voltage of the MOS device is altered. The breakdown voltage is decreased, and the lifetime is shortened.

In a conventional method of inspecting a water mark, a bare wafer or a wafer having a thin film without being patterned is provided for a test specimen. The defects of the wafer is evaluated or monitored by scanning the water mark by an inspecting machine such as a KLA/TENCOR machine, an optical microscope (OM) machine, or an atomic force microscope (AFM) machine. However, these kinds of machines can not effectively distinguish which kinds of defects are caused by particles caused by water marks. Generally speaking, the practical products commonly comprise a pattern, so that an obvious topography is shown. Thus, the process window of a patterned wafer is smaller than a bare wafer. As a consequence, the defects detected from the test specimen, that is, the inspection from the water mark of a bare wafer does not directly reflects the defects formed on a real products. On the other hand, the test wafer being processed can not be used again.

The process flow of a conventional method of inspecting water wafer marks is shown in FIG. 1. As shown as step 10, a bare wafer is provided. Or alternatively, a wafer having a thin film thereon without being patterned is provided. The wafer is used as a test specimen for water mark inspection.

In step 12, the wafer is disposed into a chemical station to form a water mark. The water mark is formed by simulating process conditions of a real wafer product.

In step 14, a defect inspection is performed to the test specimen, for example, the inspection to a water mark formed in the previous step.

In step 16, according to the water mark obtained in the test specimen the performance of a real wafer being processed in the chemical station is presumed.

FIG. 2 shows a process flow of another conventional method of inspecting a water mark. In step 20, a bare wafer or a wafer deposited with a thin film without being patterned is provided as a test specimen. In step 22, the wafer is disposed in a chemical station to form a water mark. The water mark is formed by simulating the process conditions for forming a real wafer product. In step 24, a thin film is formed on the wafer to emphasize the water mark formed in the chemical station. In step 26, a defect inspection is performed to the test specimen, for example, the inspection to a water mark formed in the previous step. In step 28, according to the water mark obtained in the test specimen, the performance of a wafer being processed in the chemical station is evaluated.

Since the real wafer products of wafers comprise patterns, an obvious surface topography is shown. However, in the conventional method of inspecting a water mark, a bare wafer or a wafer having a thin film formed thereon is used as a test specimen. Both of the bare wafer and the latter wafer do not have a pattern thereon. Even the wafer mark is formed by simulating the water mark of a real wafer product, the defects detected by inspecting the water mark cannot not precisely reflect the defects of the real wafer product. The test specimen can only be used to monitor the performance of a real wafer once, the used wafers cannot be recycled, and therefore, increases the inspection cost.

SUMMARY OF THE INVENTION

It is an object of the invention to provide a method of inspecting wafer water marks. By forming a pattern on a test specimen to inspect the water mark problem, the defect and feature of a real wafer can be more directly reflected. In addition, the test specimen can be recycled to monitor the performance of a plurality of real wafer products.

To achieve the above-mentioned objects and advantages, a method of inspecting water mark for monitoring performance of practical wafer products is provided. A test wafer is provided. An oxide layer is formed on the test wafer. A polysilicon pattern is formed on the oxide layer. The test wafer is disposed in a chemical station to obtain a water mark. A water mark inspection is performed to the test wafer. The water mark is formed under fabrication process conditions of a real wafer product of which the performance is to be evaluated and monitored, so that the result of the water mark inspection directly reflects features of the real wafer product.

In addition, a nitride layer is formed after the formation of the water mark to emphasize the topography thereof. The nitride layer is removed after the real wafer product is evaluated. The method can also be applied in performance evaluation for multiple wafer products. To evaluate the performance of another wafer product steps from forming the water mark to removing the nitride layer are reiterated until the evaluation of all the water products are accomplished.

Both the foregoing general description and the following detailed description are exemplary and explanatory only and are not restrictive of the invention, as claimed.

DESCRIPTION OF THE PREFERRED EMBODIMENTS

Figure 1:
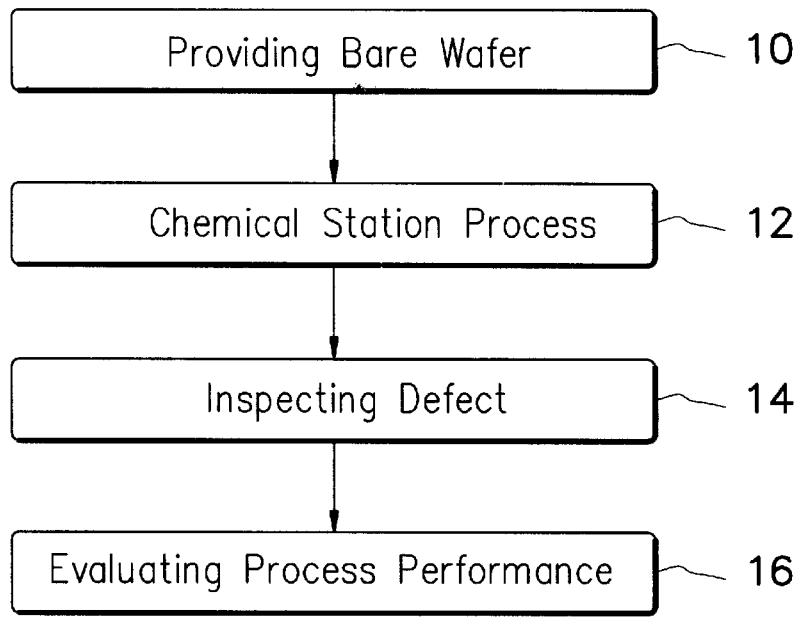
FIG. 1 shows a process flow of a conventional method for inspecting water mark.
Figure 2:
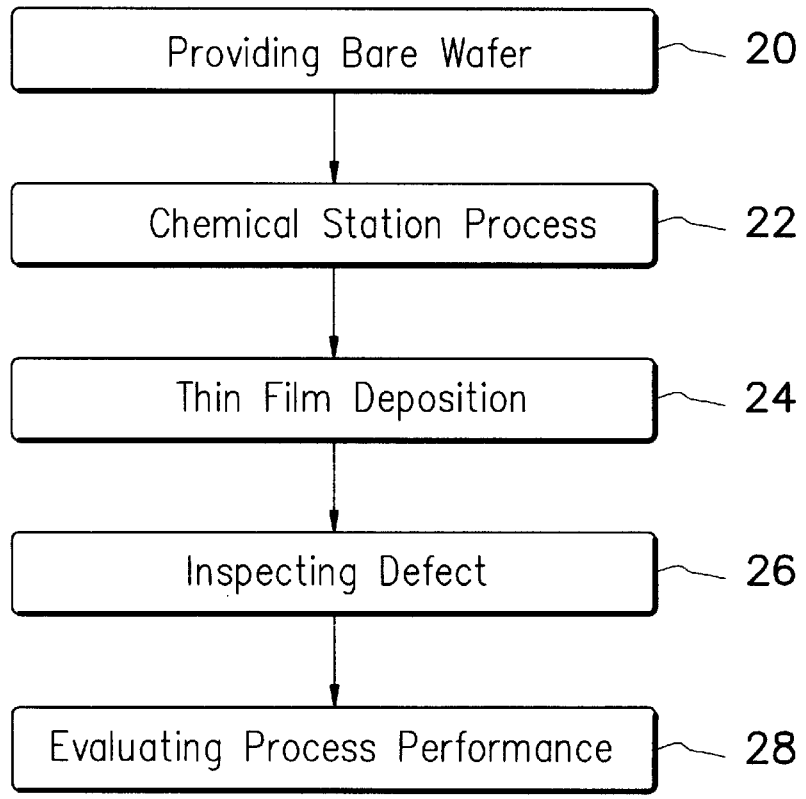
FIG. 2 is a process flow of another conventional method for inspecting water mark.
Figure 3:
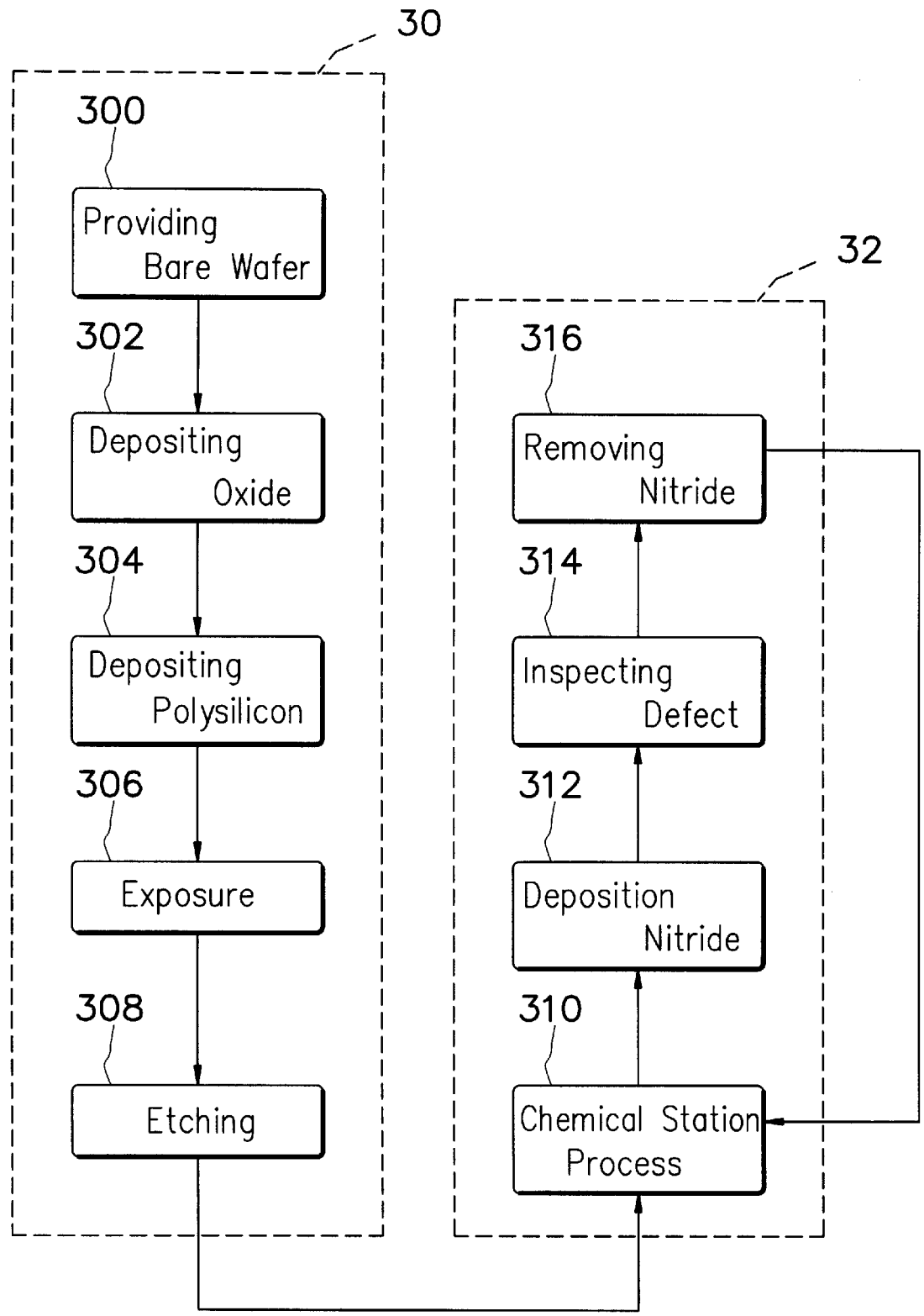
FIG. 3 shows a process flow of a method for inspecting water mark in a preferred embodiment according to the invention.

In FIG. 3, a process flow of inspecting water marks in a preferred embodiment according to the invention is shown.

The process is further categorized into two states, that is, a wafer providing stage 30 and a water mark inspection stage 32. The wafer providing stage 30 comprises process steps 300 to 308, whereas the water mark inspection stage 32 comprises process steps 310 to 316. After the first stage, that is, the wafer providing stage 30, is accomplished, the second stage, the water mark inspection stage 32, is performed. From FIG. 3, it is known that after a first cycle of inspection, the wafer can be recycle. Process steps from 310 to 316 are reiterated by using the same wafer to monitor other real wafer products.

In step 300, a bare wafer is provided. The bare wafer is used as a test specimen. In step 302, an oxide layer is formed on the bare wafer. In step 304, a polysilicon layer is formed on the oxide layer. Preferably, the polysilicon layer is formed by doped polysilicon or doped hemispherical grained silicon (HSG—Si). By exposure, a pattern in a photo-resist layer is transferred to the polysilicon layer in step 306. Preferably, the pattern transferred to the polysilicon layer is formed according to the patterns of wafers to be evaluated or monitored or specific requirements according to practical application. Thus, in the subsequent process to inspect water marks on the test specimen, the features of the inspecting results directly reflects features of wafers to be evaluated and monitored. The polysilicon layer is etched, so that a pattern is formed on the test specimen. The process is then proceeded to the second stage 32.

In the first step 310 of the second stage 32, the patterned test specimen is disposed in a chemical station to form a water mark by simulating a fabrication status of a real wafer product. As a consequence, the water mark formed on the patterned test specimen directly reflects the feature and defects of a real wafer product of which the performance is to be monitored and evaluated. A nitride layer is formed on the test specimen in step 312 to emphasize the after mark formed in step 310. In step 314. a defect inspection is performed to a wafer, for example, a water mark inspection is performed in this example. The defect inspection can be performed by scanning the patterned specimen using wafer defect inspecting machine such as a KLA/TENCOR, OM machine, or an AFM machine. The performance of the wafer is thus evaluated by the results of the defect inspection for the defect, that is, the water mark, on the specimen directly reflects the feature of the real wafer product. In step 316, the nitride layer is removed from the test specimen, for example, by using phosphoric acid, so that the test specimen wafer can be recycled for evaluating the performance of another wafer. While evaluating another wafer, the test specimen is disposed into the chemical station again after the nitride layer is removed. Thereafter, the same step is repeated as above. The process flow of the second stage 32 can thus be reiterated to evaluating performance of different practical wafer products.

Thus, the invention provides a method of inspection water mark to evaluate or monitor the performance of a practical wafer product. In the invention, the status of practical products is reflected directly from the water mark thereon by comparing a patterned test specimen. The test specimen can be recycled for evaluating performance for more than one wafer. Thus, the performance of wafers can be evaluated more directly and precisely, and the cost is decreased.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of inspecting water mark for monitoring performance of practical wafer products, comprising:

providing a test wafer;

forming an oxide layer on the test wafer;

forming a polysilicon layer on the oxide layer, wherein the polysilicon layer has a pattern thereon according to a real wafer product;

disposing the test wafer in a chemical station to obtain a water mark; and inspecting the water mark of the test wafer.

2. The method according to claim 1, further comprising a step of forming a nitride layer on the test wafer after the formation of the water mark.

3. The method according to claim 2, wherein the nitride layer is formed to emphasize the water mark.

4. The method according to claim 1, wherein the polysilicon pattern includes a doped polysilicon layer.

5. The method according to claim 1, wherein the polysilicon pattern includes a hemispherical grain silicon (HSG—Si).

6. The method according to claim 1, wherein the water mark is obtained by simulating fabrication conditions of a real water product, of which a performance is to be reflected by inspecting the water mark.

7. The method according to claim 1, wherein the water mark is inspected by scanning the test by a defect inspecting machine.

8. The method according to claim 7, wherein the defect inspecting machine includes a KLA/TENCOR machine.

9. The method according to claim 7, wherein the defect inspecting machine includes a optical microscope machine.

10. The method according to claim 6, wherein the defect inspecting machine includes an atomic force microscope machine.

11. A method of inspecting water marks on a test wafer to evaluate performance of a plurality of wafer products, comprising:

a. forming an oxide layer on the test wafer;

b. forming a polysilicon layer on the oxide layer, wherein the polysilicon layer has a pattern thereon according to a real wafer product which is to be evaluated;

c. forming a water mark on the test wafer according to fabrication process conditions of one of the wafer products to be evaluated;

d. forming a nitride layer on the test wafer to emphasize the water mark;

e. inspecting the water mark to presume performance of the wafer products to be evaluated;

f. removing the nitride layer;

g. reiterating steps c to f until all the wafer products are evaluated.

12. The method according to claim 11, wherein the nitride layer is formed to emphasize the water mark.

13. The method according to claim 11, wherein the polysilicon pattern includes a doped polysilicon layer.

14. The method according to claim 11, wherein the polysilicon pattern includes a hemispherical grain silicon (HSG—Si).

15. The method according to claim 11, wherein the water mark is inspected by scanning the test by a defect inspecting machine.

16. The method according to claim 15, wherein the defect inspecting machine includes a KLA/TENCOR machine.

17. The method according to claim 16, wherein the defect inspecting machine includes a optical microscope machine.

18. The method according to claim 16, wherein the defect inspecting machine includes an atomic force microscope machine.

* * * * *